United States Patent [19]

Chen

[11] Patent Number: 5,501,998
[45] Date of Patent: Mar. 26, 1996

[54] METHOD FOR FABRICATING DYNAMIC RANDOM ACCESS MEMORY CELLS HAVING VERTICAL SIDEWALL STACKED STORAGE CAPACITORS

[75] Inventor: Chung-Zen Chen, Taipei, Taiwan

[73] Assignee: Industrial Technology Research Institution, Hsinchu, Taiwan

[21] Appl. No.: 233,768

[22] Filed: Apr. 26, 1994

[51] Int. Cl.[6] .......................... H01L 21/70; H01L 27/00
[52] U.S. Cl. ................. 437/52; 437/60; 437/919
[58] Field of Search ................. 437/52, 919, 47, 437/60

[56] References Cited

U.S. PATENT DOCUMENTS

| | | | |
|---|---|---|---|
| 5,102,820 | 4/1992 | Chiba | 437/52 |
| 5,126,916 | 6/1992 | Tseng | 361/313 |
| 5,155,056 | 10/1992 | Jeong-Gyoo | 437/47 |
| 5,185,282 | 2/1993 | Lee et al. | 437/47 |
| 5,338,700 | 8/1994 | Dennison et al. | 437/60 |
| 5,364,811 | 11/1994 | Ajika et al. | 437/52 |

Primary Examiner—Mary Wilczewski
Assistant Examiner—H. Jey Tsai
Attorney, Agent, or Firm—George O. Saile

[57] ABSTRACT

A new method for fabricating a microminiature capacitor, on a dynamic random access memory (DRAM) cell, using a single masking level was accomplished. The method involves opening the self-aligned node contact and the area for the bottom electrode of the capacitor, at the same time, using one masking level. The planarization of a low flow temperature glass (BPSG) and an etch back technique is used to define the bottom electrode of the capacitor, which is self-aligned to the etched opening. The resulting capacitor has vertical side walls on the perimeter of the capacitor plate, which increases its area without increasing the lateral area on the DRAM cell. Using one masking level for the fabrication of the capacitor, also eliminates the need to add additional space for the tolerance of a second mask.

25 Claims, 5 Drawing Sheets

METHOD FOR FABRICATING DYNAMIC RANDOM ACCESS MEMORY CELLS HAVING VERTICAL SIDEWALL STACKED STORAGE CAPACITORS

RELATED PATENT APPLICATION

Ser. No. 08/233,766, filed Apr. 26, 1994 entitled DRAM CELL PROCESS HAVING ELK HORN SHAPED CAPACITOR by the same inventor.

BACKGROUND OF THE INVENTION

1. Field of the Invention

The present invention relates to the fabrication of a dynamic random access memory (DRAMs) device, and more particularly, a fabrication technique for making microminiaturized storage capacitor used for charge storage.

2. Description of the Prior Art

Very large scale integration (VLSI) technologies have greatly increased the circuit density on the chip, and have significantly improved the circuit performance and reduced the cost of todays electronic products. Further improvement in the performance to cost ratio depends strongly on continued down scaling of these devices on a VLSI chip. One type of VLSI chip, the dynamic random access memory (DRAMs), is used extensively in the electronic industry and particularly in the computer industry for electrical data storage. These DRAM chips consist of an array of individual cells which store a unit of data (bit) and contain one charge passing transistor, usually a MOSFET, and a single storage capacitor. In the next 5 to 10 years the number of these cells, on a chip, are expected to reach 256 megabits per chip. To achieve these advances in data storage and maintain a reasonable chip size, the individual memory cells, on the chip, must be significantly reduced in size.

As these individual memory cells decrease in size, so must also the MOSFET charge passing transistor and the storage capacitor, decrease in size. However, the reduction in the storage capacitor size makes it difficult to store sufficient charge on the capacitor to maintain an acceptable signal-to-noise level. Also, these smaller storage capacitor require shorter refresh cycle times to retain the necessary charge level.

When these microminiature capacitors are further reduced in size, it also becomes more difficult to improve the masking level tolerance and the etch tolerance required for manufacturing good memory chips. To avoid these problems, others have proposed methods for self-aligning the storage node contact of the capacitor to the device contact on the substrate. But they still require masking and etching to form the capacitor electrode structure. See for example, K. Jeong-Gyoo U.S. Pat. No. 5,155,056. The demanding tolerances associated with the mask alignment and etching, still remains as a problem that limits the size of these micro miniature capacitors.

Since it is important to provide a storage capacitor with the largest possible capacitance, it is very important to have not only the storage node contact aligned to the substrate, but to also have the capacitor electrode formed in a way that does not depend on these masking and etching tolerances.

SUMMARY OF THE INVENTION

It is an object of the present invention to provide a storage capacitor whose capacitor node contact is self-aligned to the contact of the device on the substrate. For example, to the source or drain of the a field effect transistor.

It is another object of this invention to provide a bottom storage capacitor electrode which is formed by the same masking level that is used to form the self-aligned capacitor node contact.

It is still another object of this invention to provide a method for achieving this single masking level structure using a planarization method.

A further object of this invention is to increase the area of the capacitor by fabricating vertical sidewalls on the capacitor perimeter, without increasing the surface area of the DRAM cell.

And it is still a further object of this invention to improve reliability and reduce cost by reducing the masking levels required to fabricate this charge storage capacitor.

BRIEF DESCRIPTION OF THE DRAWINGS

The object and other advantages of this invention are best explained in the preferred embodiment with reference to the attached drawing that include.

DESCRIPTION OF THE PREFERRED EMBODIMENTS

Now in keeping with the objects of the invention, the method for forming the self-aligned storage capacitor is covered in detail. This capacitor can be fabricated on MOSFET structures that are currently used in the manufacture of DRAMs. Therefore, only those details of the underlying structure will be described that are necessary for understanding the current invention.

Figure 1:
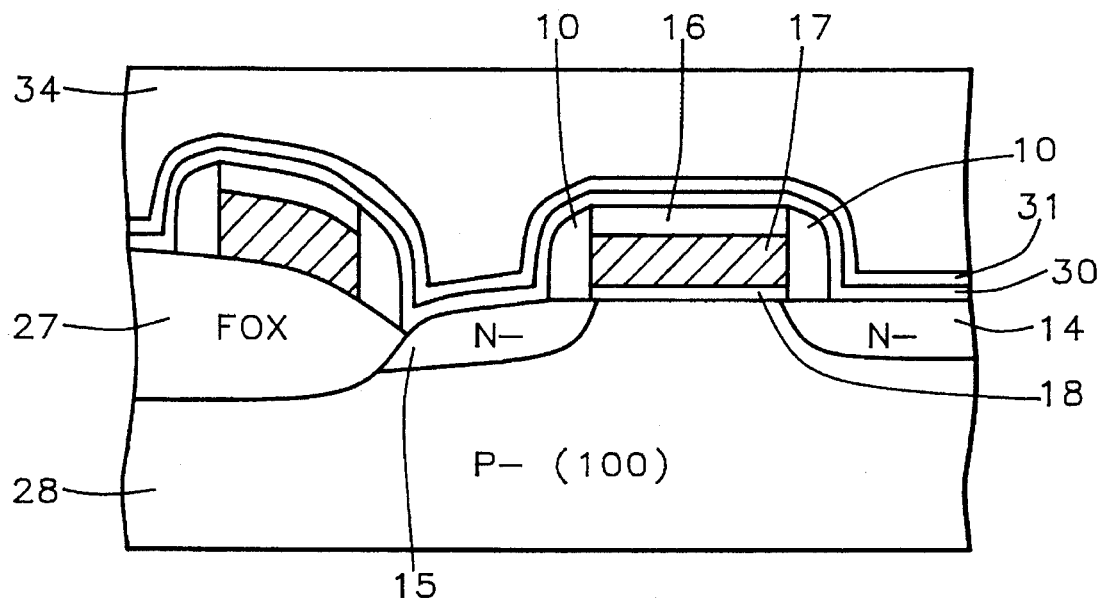
FIGS. 1 through 8 which illustrate schematically the cross-section representation of a DRAM cell having a charge storage capacitor and a MOSFET as the charge passing switch. The Figs. follow the process flow in the preferred embodiment for making the self aligning capacitor contact and bottom capacitor electrode with a single masking level.

Referring now to FIG. 1, a cross-sectional view of the substrate 28, with a MOSFET transistor built on its surface, is shown schematically. The preferred substrate is composed of a P type single crystal silicon with a <100> crystallographic orientation. A thick Field OXide 27 (FOX), for isolating the device, is first formed surrounding the region where the device is to be built. Briefly, the method commonly practiced in the industry is to use a thin thermal oxide (pad oxide) and a silicon nitride layer as an oxidation resistant mask. The desired field oxide regions are etched open in the oxide/nitride layer using conventional photolithographic techniques and a field oxide is thermally grown, typically to a thickness of about 4500 to 5500 angstroms.

The semiconductor devices are then fabricated on the silicon surface in the non-oxidize areas, after removing the silicon nitride layer using a wet etch. For example, using a solution of heated phosphoric acid ($H_3PO_4$). For the DRAM cell, the typical transistor used is a metal-oxide-semiconductor field effect transistor (MOSFET) and is now briefly described. The silicon surface is first carefully cleaned and a good quality thermal oxide is grown to form the gate oxide 18. The preferred thickness is between about 80 to 200 Angstroms. Next, the gate electrode structure is formed by first depositing a polysilicon layer 17, for example, using a low pressure chemical vapor deposition (LPCVD) deposition. The preferred thickness is usually in the range from 1000 to 4000 Angstroms. After the gate polysilicon is appropriate doped, an insulating layer 16 composed of silicon oxide or alternatively silicon oxide and silicon nitride is then deposited on the polysilicon. The gate structure is then formed by anisotropic etching in a low pressure plasma etcher using an appropriate gas mixture. Conventional photolithographic technique are used for defining the etch mask.

The next step is to form the lightly doped source/drain 14, 15 of the N-channel MOSFET. This doping is usually accomplished by implanting a N-type species, such as arsenic or phosphorous. For example, a typical implantation might consist of a phosphorous $p^{31}$ at a dose of between 1 to 10 E 13 atoms/cm$^2$ and with an energy of 30 to 80 Kev. As known by one skilled in the art, a photoresist masking can be used to avoid implanting in areas not requiring the implant.

After forming the lightly doped source/drain, side wall spacers 10 are formed on the gate electrode structure. These spacers are formed by depositing a blanket layer of low temperature silicon oxide on the substrate and using an anisotropic etch to etch back to the source/drain surface. For example, the silicon oxide can be a chemical vapor deposition using tetraethoxysilane (TEOS) at a temperature in the range of about 650° to 900° C., and the etch back can be accomplished with a reactive plasma etcher of various design and using an appropriate gases mixture. For example, the etching can be performed in a gas mixture of carbon tetrafluoride and hydrogen ($CF_4/H_2$).

The remainder of this embodiment relates more particularly to the objects of this invention which describes in detail the formation of the stacked storage capacitor and form specifically to the fabrication of the bottom electrode of the storage capacitor and self-aligned node contact using a single masking level.

Referring still to FIG. 1, the capacitor structure is fabricated by depositing a first insulating layer 30 composed of silicon oxide followed by depositing a second insulating layer 31 composed of silicon nitride. The preferred process for the silicon oxide layer 30 is a deposition in a low pressure chemical vapor deposition (LPCVD) process reactor using, for example, tetraethoxysilane (TEOS), at a preferred temperature range of between about 700° to 750° C. and having a preferred thickness in the range from about 300 to 800 Angstroms. The process of choice for the silicon nitride layer is a plasma enhanced chemical vapor deposition (PECVD) technique in a temperature range of between about 300° to 400° C. and having a preferred thickness of between about 300 to 800 Angstroms. Shown next in FIG. 1, a third insulating layer 34 composed of borophosphosilicate glass (BPSG) and having a low flow temperature, is then deposited. The preferred thickness range for layer 34 is from between about 5000 to 7000 Angstroms. The BPSG layer 34 is then thermally anneal at a temperature of between about 850° to 900° C. for about 30 minutes to effectively planarize the surface. An alternative approach is to use rapid thermal annealing at an elevated temperature of about 1000° C. for a time of about 30 seconds.

Figure 2:
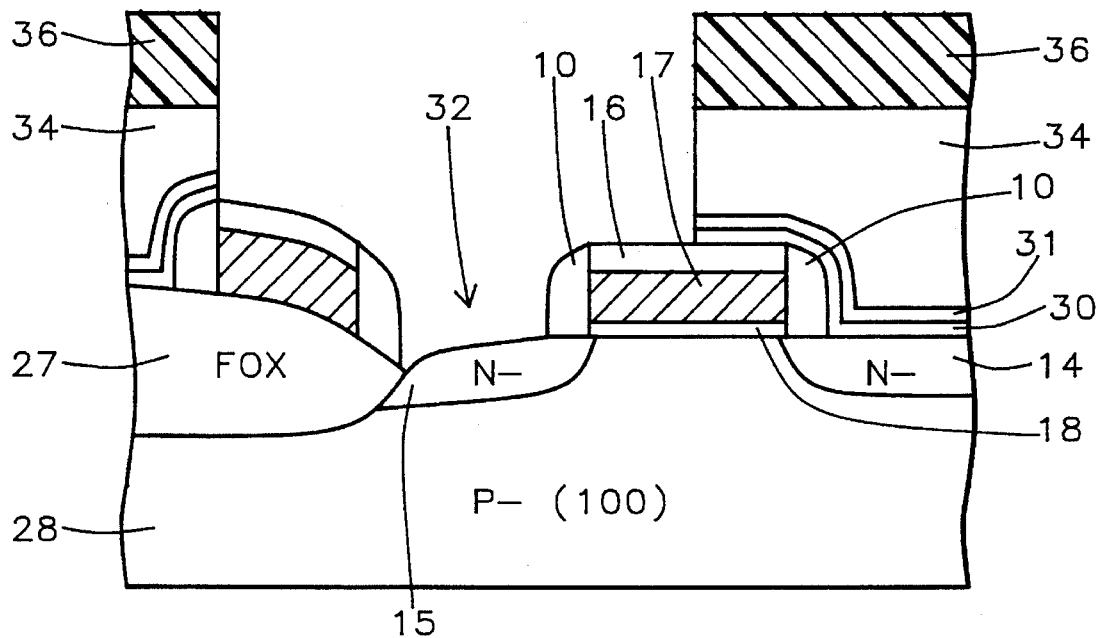

Now referring to FIG. 2, the sequence of steps are shown for defining both the self-aligned node contact and the bottom electrode of the stacked capacitor using a single masking step. First, the planar surface of the BPSG layer 34 is coated with a photoresist 36, for example, a PFI26A9 type photoresist manufactured by the Summitomo Chemical Corp. of Japan can be used and then a conventional photolithographic process is used to open the regions for the node contact. This same masking step also serves to defines the area of the bottom electrode. The BPSG layer 34 is then etched using an anisotropic etch process. For example, a reactive plasma etcher using a gas mixture of trifluoromethane ($CHF_3$) and carbon tetrafluoride ($CF_4$) and at a process pressure of about 300 mTorr can be used. The underlying silicon nitride layer 31 provides the etch stop for the BPSG etching. The preferred etch rate selectivity of BPSG to $Si_3N_4$ should be greater than about 10 to 1. The silicon nitride is then removed in a hot phosphoric acid etch at a temperature of about 150° C. and the bottom TEOS layer 30 is removed by anisotropic etching to expose the substrate surface in the node contact area for the capacitor. The thick field oxide and the gate sidewalls are used to self-align the node contact to the source/drain 15 of the MOSFET. This prepares the substrate for the next step, in which the bottom electrode of the storage capacitor is formed.

Figure 3:
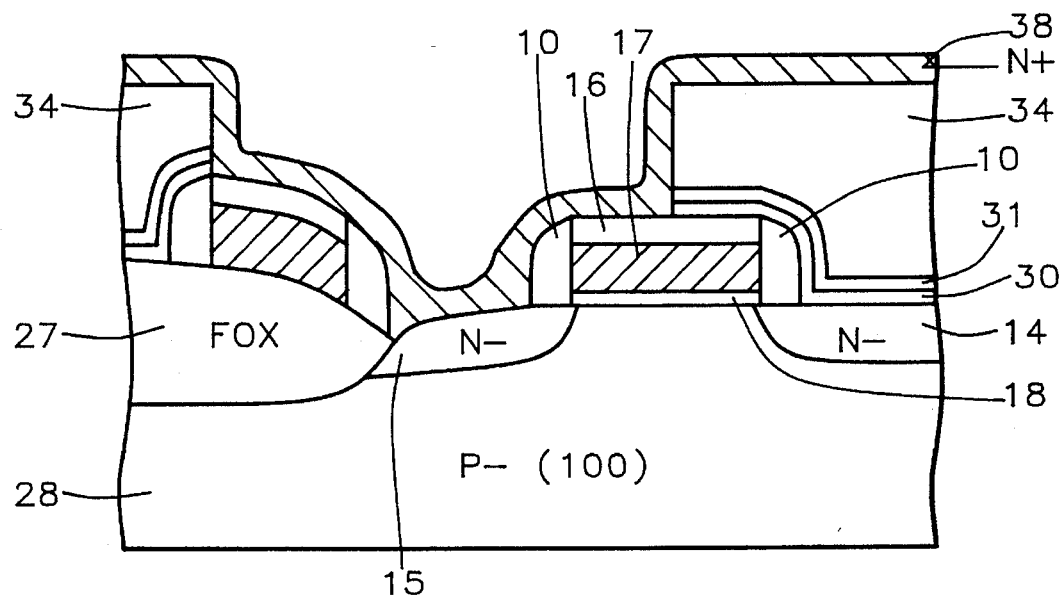

Now referring to FIG. 3, the bottom capacitor electrode, also referred to as the capacitor node electrode, is now formed by using a low pressure chemical vapor deposition (LPCVD) to deposit a first polysilicon layer 38. The preferred thickness of layer 38 having a range of between about 500 to 1000 Angstroms, and having a process temperature in the ranges of about 550° to 600° C. The dopant level in the node contact is then achieved by introducing a N type impurity into the polysilicon layer 38, either by implanting or in situ doping. A thermal cycle is used later in the process, to drive in the dopant and form the ohmic contact. The preferred dopant type is a N-type impurity, such as phosphorous, and polysilicon layer 38 is preferably doped to a concentration of between about 5 E 19 to 2 E 20 atoms/cm$^3$. The bottom capacitor electrode is formed completely from a single polysilicon layer.

Figure 4:
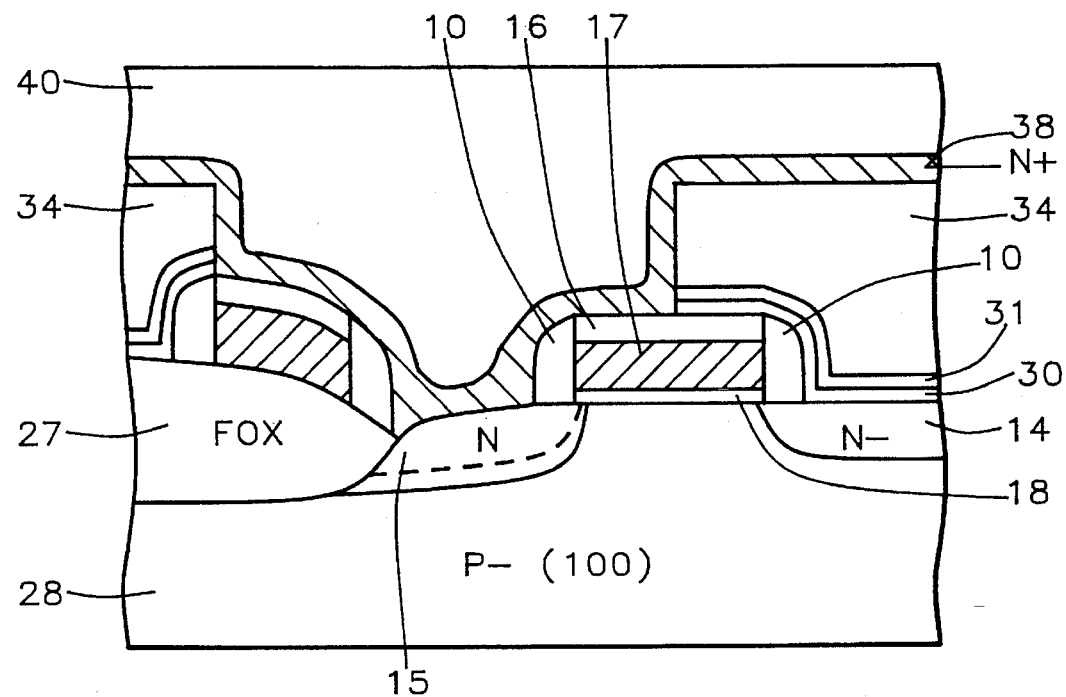
Figure 5:
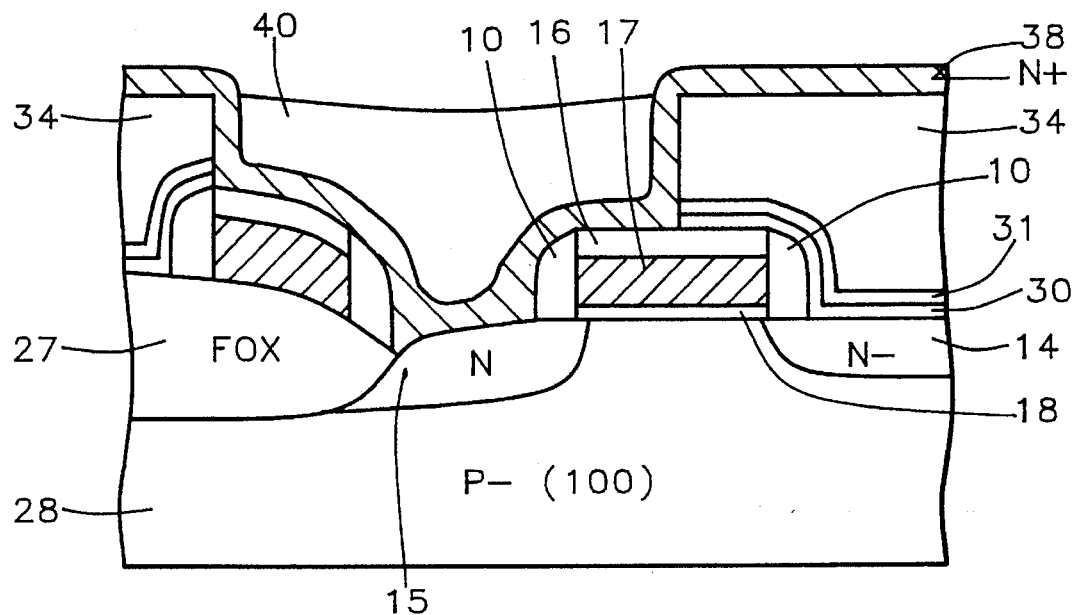

Now as shown in FIG. 4, A fourth insulating layer 40 composed of BPSG is deposited and planarized using a process similar to the technique used for the previous BPSG layer 34 shown in FIG. 1. The fourth insulating layer has a preferred thickness of between about 3500 to 5000 Angstroms In this step, however, the planarizing anneal can also be adjusted to drive-in the N type dopant from the polysilicon layer 38 into the source or drain contact of the MOSFET, thereby forming the desired ohmic contact. After this planarizing anneal, the BPSG layer 40 is etched back to expose the bottom electrode polysilicon 38 in the area external to the node contact area, as shown in FIG. 5. The preferred etch back process is one with a high etch rate selectivity of BPSG to polysilicon. For example, by etching in a plasma etcher having a gas mixture of trifluoromethane ($CHF_3$) and carbon tetrafluoride ($CF_4$) and having an etch rate selectivity of about 10 to 1 between BPSG and polysilicon.

Figure 6:
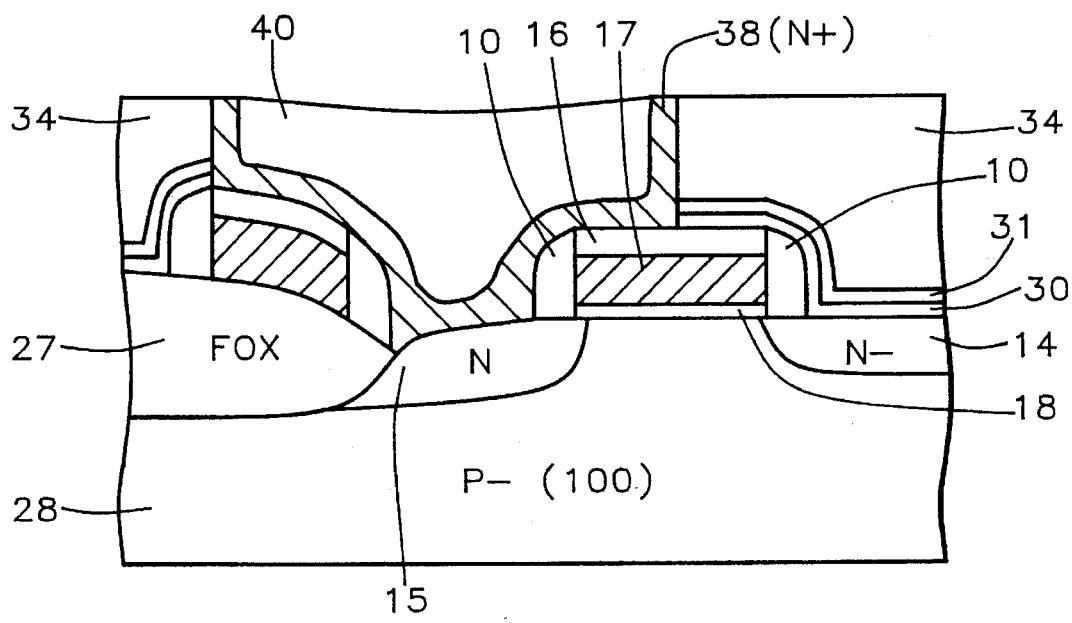

Now referring to FIG. 6, the exposed polysilicon is selectively etched to the surface of the BPSG layer 34. This etch back of the first polysilicon layer 38 defines the outer perimeter of the bottom electrode of the capacitor, which is formed from the remaining portion of the polysilicon layer 38, and is self-aligned to the node contact opening,as shown in FIG. 6, The etch back process of choice is done in a plasma etcher using a reactive gas mixture of, for example, chlorine ($Cl_2$) and hydrogen bromide (HBr) and having an etch selectivity of polysilicon to BPSG of about 20 to 1.

Figure 7:
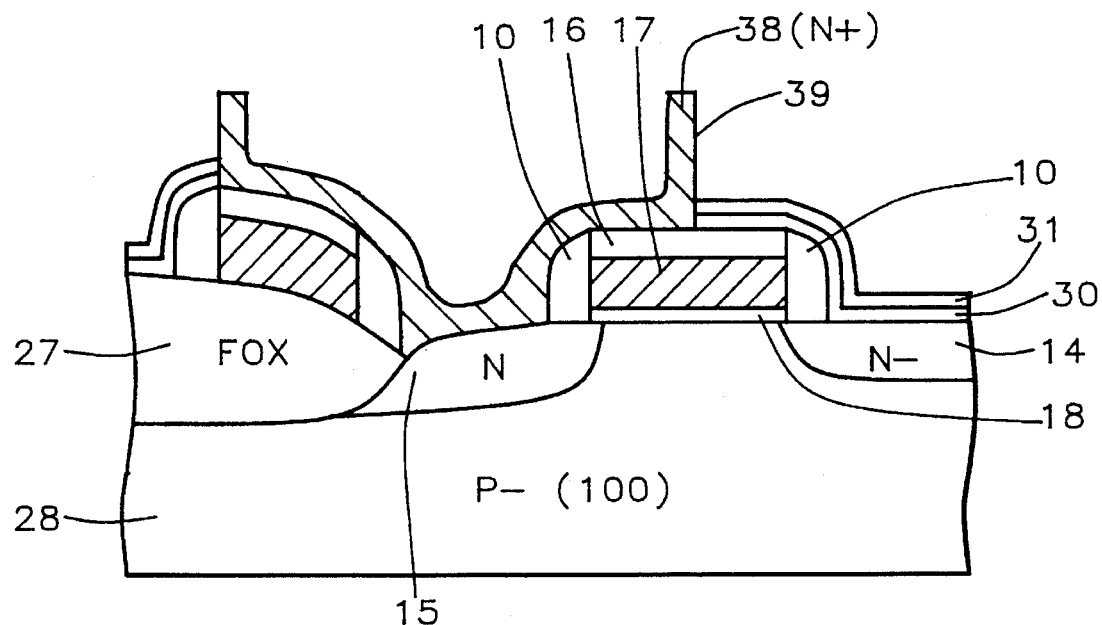

Now referring to FIG. 7, the next step is to completely remove the remaining BPSG using a conventional wet etch process, such as, buffered hydrofluoric acid (BHF). The third insulating layer 34 and fourth insulating layers 40, composed of BPSG and depicted in FIG. 6 are isotropically etched in BHF having a concentration of about 0.5 to 1.0. The polysilicon layer 38 acts as the etch stop in the contact node area and the silicon nitride layer 31 serves as the etch stop outside the node contact area.

Also, since the capacitor plate extends vertically at the perimeter, as shown in the FIG. 7, it is clear that the capacitor area can be increased further by simply increasing the thickness of the BPSG layer 34 without increasing further the substrate area required for the capacitor. The polysilicon surface of this bottom electrode can be further increased in effective area, by using techniques to roughen the surface. See for example, H. C. Tuan et al U.S. Pat. No. 5,266,514.

Still referring to FIG. 7, the bottom electrode which is now free of the BPSG layers 34 and 40, is ready to be thermally oxidized and optionally processed to receive other types of high dielectric constant films. This dielectric layer 39, depicted in FIG. 7 as the surface of layer 38, should preferably be as thin as possible and have the highest dielectric constant possible. However, practical limitation at present limit films to thickness in the range of 30 to 250 Angstroms. Composite films of silicon oxide/silicon nitride/ silicon oxides (ONO) are currently preferred over a single layer of silicon oxide because of its improved properties. For example, the nitride has a much higher dielectric constant (6–9) and the composite is less prone to having pin holes, which can cause inter electrode shorts between the capacitor electrodes. For example, the bottom electrode 38 can be thermally oxidized to form a silicon oxide ($SiO_2$) and then exposed to ammonia ($NH_3$) at about 900° C. to reactively form a silicon nitride ($Si_3N_4$) layer. Alternatively, a silicon nitride layer can be deposited by plasma enhanced chemical vapor deposition (PECVD) and then thermally oxidized to reduce the surface and form a thin silicon oxide ($SiO_2$). These methods can be used to form the inter electrode dielectric 39 having a high dielectric constant and a low pin hole density.

Figure 8:
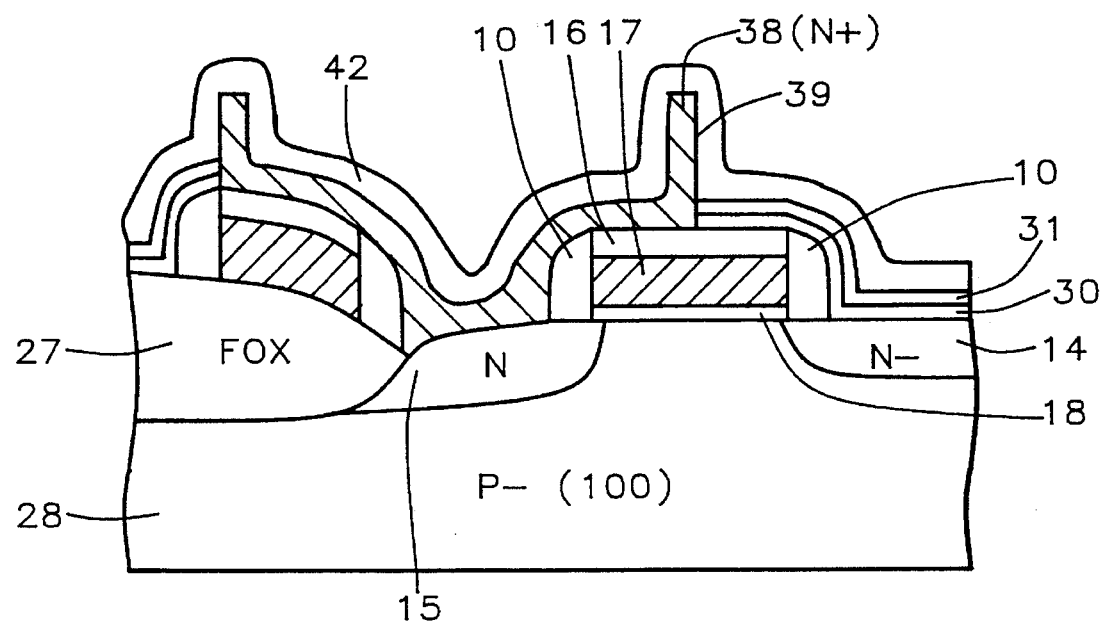

As shown in FIG. 8, a second polysilicon layer 42, is then deposited over the thin dielectric layer 39 to complete the capacitor structure. The top polysilicon layer 42 is also doped with a N type impurity to increase its electrical conductivity. The dopant species, for example can be phosphorous, and the preferred concentration in the polysilicon layer 42 is in a range of between about 5 E 19 to 2 E 20 atoms/$cm^3$. The thickness of the second polysilicon layer 42 forming the top capacitor electrode is between about 800 to 1000 Angstroms.

Figure 9:
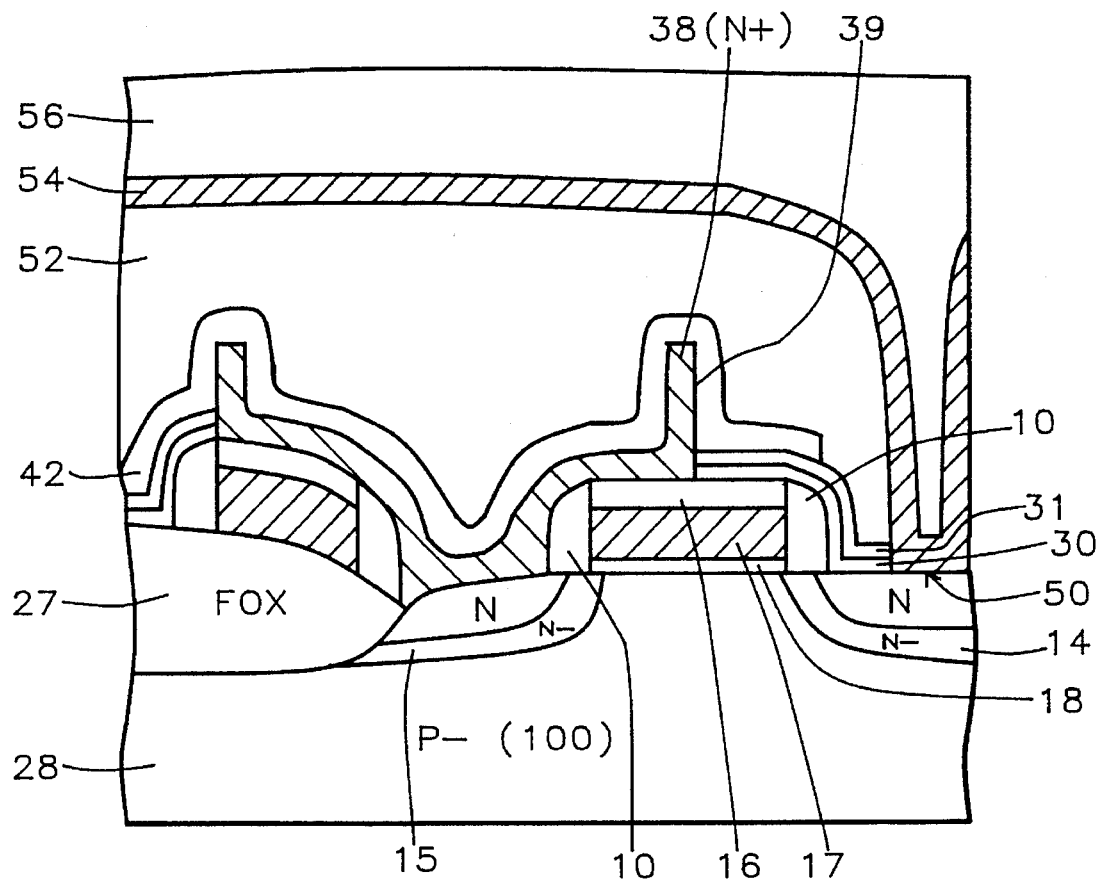
FIG. 9 shows the completed cell structure up to the polysilicon or silicide bit line and the over laying insulation.

Now referring to FIG. 9, the schematic shows a cross-sectional view of a completed DRAM structure having this new stacked capacitor structure. The top polysilicon layer 42 of the storage capacitor is opened over the bit line contact 50. Next a fifth insulating layer 52, such as BPSG, that supports the bit line wiring, is deposited to a preferred thickness in the range of between about 3500 to 5000 Angstroms. The bit line contact mask and an appropriate photolithographic process are then used to open the bit line contact in the BPSG insulation 52, the silicon nitride layer 31 and the TEOS deposited layer 30. A third polysilicon layer 54 is deposited to form the bit line metallurgy. This polysilicon layer 54 is deposited and doped N type, for example, by implanting with arsenic or phosphorous ions. The substrate is then annealed to drive in the N type dopant to form the appropriate ohmic contact in the bit line contact 50. Next, a silicide layer is formed on the bit line polysilicon layer 54 to increase its conductivity. The preferred method is the deposition of a metal layer followed by a low temperature alloying anneal. The preferred silicide being tungsten silicide (WSi). The WSi bit line wiring is now patterned using photolithographic techniques and a reactive ion etching process, and then a sixth insulating layer 56, for example a BPSG layer, is deposited and anneal at elevated temperature to planarize the surface and complete the dynamic random access memory (DRAM) cell.

While the invention has been particularly shown and described with reference to the preferred embodiments thereof, it will be understood by those skilled in the art that various changes in form and details may be made without departing from the spirit and scope of the invention.

What is claimed is:

1. A method for fabricating a capacitor on a semiconductor substrate having a device region formed therein comprising the steps of:

depositing a first insulating layer on said substrate;

depositing a second insulating layer on said first insulating layer forming a diffusion barrier and etch stop layer on said substrate; and depositing a third insulating layer composed of borophosphosilicate glass on said second insulating layer and planarizing said third insulating layer;

forming openings through said third, second and first insulating layers to said device region in said substrate;

depositing a first polysilicon layer over said substrate and said openings to thereby form a bottom capacitor electrode and making electrical contact to the said device region therein;

depositing and planarizing a fourth insulating layer over said first polysilicon layer and planarizing said fourth insulating layer by thermal anneal; and etching back said fourth insulating layer until said first polysilicon layer is exposed in areas external to said openings;

etching back said first polysilicon layer in areas external to said openings to complete and isolate said bottom capacitor electrodes over and aligned to said openings;

etching completely said third and fourth insulating layers to expose top and sides of said bottom capacitor electrodes and exposing said second insulation layer elsewhere outside the bottom capacitor electrode on said substrate;

forming a dielectric layer on surfaces of said isolated bottom capacitor electrodes; and depositing a second polysilicon layer on said dielectric layer, and on said second insulating layer elsewhere on said substrate forming a top capacitor electrode.

2. The method of claim 1, wherein said first insulating layer is composed of silicon dioxide formed from chemical vapor deposition in tetraethoxysilane (TEOS) and having a thickness from about 300 to 800 Angstroms.

3. The method of claim 1, wherein said second insulating layer is composed of silicon nitride having a thickness range from about 300 to 800 Angstroms.

4. The method of claim 1, wherein said third insulating layer is composed of a borophosphosilicate glass (BPSG) having a thickness in the range of about 5000 to 7000 Angstroms.

5. The method of claim 4, wherein said borophosphosilicate glass is planarized by thermal annealing in the temperature range of about 850° to 900° C. for a time of about 30 minutes.

6. The method of claim 1, wherein said openings forming step comprises the steps of photoresist masking and anisotropic etching said third insulating layer selectively to said second insulating layer, etching in phosphoric acid said second insulating layer to said first insulating layer, and anisotropically etching said first insulating layer to said substrate.

7. The method of claim 1, wherein said bottom capacitor electrode composed of said first polysilicon layer is doped N type impurity having a concentration of between about 5 E 19 to 2 E 20 atoms/cm$^3$ and having a thickness range from between about 500 to 1000 Angstroms.

8. The method of claim 1, wherein said fourth insulating layer is composed of borophosphosilicate glass having a thickness range between 3500 to 5000 Angstroms and made planar by annealing in a temperature range from between 850° to 900° C.

9. The method of claim 1, wherein said etching of said third and fourth insulating layers is an isotropic etching and is performed in a buffered hydrofluoric acid having a concentration of about 0.5 to 1.0 percent.

10. The method of claim 1, wherein said dielectric layer is a composite silicon oxide/silicon nitride/silicon oxide (ONO) having a thickness in the range from about 30 to 250 Angstroms.

11. The method of claim 1 wherein said top capacitor electrode layer composed of said second polysilicon layer is doped N-type impurity having a concentration range from about 5 E 19 to 2 E 20 atoms/cm$^3$ and having a thickness in the range from about 800 to 1000 Angstroms.

12. The method of claim 1 wherein said bottom capacitor electrode is formed completely from a single polysilicon layer and having vertical wall components which increases capacitance.

13. The method of claim 1 wherein said device region is a source/drain region and said capacitor is a part of a DRAM cell.

14. A method for fabricating a DRAM cell with a Field Effect Transistor (FET) having a device source/drain and a capacitor formed on and in a semiconductor substrate therein comprising the steps of forming said capacitor by:

depositing a first insulating layer on said substrate;

depositing a second insulating layer on said first insulating layer forming a diffusion barrier and etch stop layer on said substrate; and depositing a third insulating layer composed of borophosphosilicate glass on said second insulating layer and planarizing said third insulating layer;

forming openings through said third, second and first insulating layers to said FET device source/drain on and in said substrate;

depositing a first polysilicon layer over said substrate and said openings to thereby form a bottom capacitor electrode and making electrical contact to said FET source/drain therein;

depositing and planarizing a fourth insulating layer over said first polysilicon layer and planarizing said fourth insulating layer by thermal anneal; and etching back said fourth insulating layer until said first polysilicon layer is exposed in areas external to said openings;

etching back said first polysilicon layer in areas external to said openings to complete and isolate said bottom capacitor electrodes over and aligned to said openings thereby forming completely from a single polysilicon layer vertical wall components which increase capacitance;

etching completely said third and fourth insulating layers to expose top and sides of said bottom capacitor electrodes and exposing said second insulation layer elsewhere outside the bottom capacitor electrode on said substrate;

forming a dielectric layer on surfaces of said isolated bottom capacitor electrodes; and depositing a second polysilicon layer on said dielectric layer, and on said second insulating layer elsewhere on said substrate and thereby forming a top capacitor electrode.

15. The method of claim 14, wherein said first insulating layer is composed of silicon dioxide formed from chemical vapor deposition in tetraethoxysilane (TEOS) and having a thickness from about 300 to 800 Angstroms.

16. The method of claim 14, wherein said second insulating layer is composed of silicon nitride having a thickness range from about 300 to 800 Angstroms.

17. The method of claim 14, wherein said third insulating layer is composed of a borophosphosilicate glass (BPSG) having a thickness in the range of about 5000 to 7000 Angstroms.

18. The method of claim 17, wherein said borophosphosilicate glass is planarized by thermal annealing in the temperature range of about 850 to 900° C. for a time of about 30 minutes.

19. The method of claim 14, wherein said openings forming step comprises the steps of photoresist masking and anisotropic etching said third insulating layer selectively to said second insulating layer, etching in phosphoric acid said second insulating layer to said first insulating layer, and anisotropically etching said first insulating layer to said substrate.

20. The method of claim 14, wherein said bottom capacitor electrode composed of said first polysilicon layer is doped with N type impurity having a concentration of between 5 E 19 to 2 E 20 atoms/cm$^3$ and having a thickness range from between about 500 to 1000 Angstroms.

21. The method of claim 14, wherein said fourth insulating layer is composed of borophosphosilicate glass having a thickness range between 3500 to 5000 Angstroms and made planar by annealing in a temperature range from between 850° to 900° C.

22. The method of claim 14, wherein said etching of said third and fourth insulating layers is an isotropic etching and is performed in a buffered hydrofluoric acid having a concentration of about 0.5 to 1.0 percent.

23. The method of claim 14, wherein said dielectric layer is a composite silicon oxide/silicon nitride/silicon oxide (ONO) having a thickness in the range from about 30 to 250 Angstroms.

24. The method of claim 14 wherein said top capacitor electrode layer composed of said second polysilicon layer is doped with N-type impurity having the concentration range from about 5 E 19 to 2 E 20 atoms/cm$^3$ and having a thickness in the range from about 800 to 1000 Angstroms.

25. A method for fabricating a capacitor on a semiconductor substrate having a device region formed therein comprising the steps of:

depositing a first insulating layer on said substrate;

depositing a second insulating layer on said first insulating layer forming a diffusion barrier and etch stop layer on said substrate; and depositing a third insulating layer composed of borophosphosilicate glass on said second insulating layer, and planarizing said third insulating layer;

forming openings through said third, second and first insulating layers to said device region in said substrate;

depositing a first polysilicon layer over said substrate and said openings to thereby form a bottom capacitor electrode and making electrical contact to the said device region therein;

depositing and planarizing a fourth insulating layer composed of borophosphosilicate glass over said first polysilicon layer and planarizing said fourth insulating layer by thermal annealing at a temperature between 850° to 900° C.;

etching back said fourth insulating layer until said first polysilicon layer is exposed in areas external to said openings;

etching back said first polysilicon layer in areas external to said openings to complete and isolate said bottom capacitor electrodes over and aligned to said openings;

etching completely said third and fourth insulating layers to expose top and sides of said bottom capacitor electrodes and exposing said second insulation layer elsewhere outside the bottom capacitor electrode on said substrate;

forming a dielectric layer on surfaces of said isolated bottom capacitor electrodes; and depositing a second polysilicon layer on said dielectric layer, and on said second insulating layer elsewhere on said substrate forming a top capacitor electrode.

* * * * *